US006719091B1

(12) United States Patent
Brown

(10) Patent No.: US 6,719,091 B1
(45) Date of Patent: Apr. 13, 2004

(54) COAXIAL SPEAKER SYSTEM

(76) Inventor: Robert J. Brown, 5302 Independence Ave., Arlington, TX (US) 76017

(*) Notice: Subject to any disclaimer, the term of this patent is extended or adjusted under 35 U.S.C. 154(b) by 0 days.

(21) Appl. No.: 10/084,728

(22) Filed: Feb. 26, 2002

(51) Int. Cl.[7] .................................................. H05K 5/00
(52) U.S. Cl. ........................................ 181/153; 181/199
(58) Field of Search ................................ 181/153, 156, 181/196, 144, 145, 147, 146, 151, 152, 199

(56) References Cited

U.S. PATENT DOCUMENTS 3,816,672 A * 6/1974 Gefvert et al. .............. 181/144
4,164,988 A 8/1979 Virva
4,760,601 A 7/1988 Pappanikoloau
4,819,761 A 4/1989 Dick
5,191,177 A 3/1993 Chi
5,359,664 A * 10/1994 Steuben ...................... 181/153
5,864,100 A 1/1999 Newman
5,988,314 A 11/1999 Negishi
6,079,515 A 6/2000 Newman
6,431,308 B1 * 8/2002 Vollmer et al. ............. 181/144

* cited by examiner

*Primary Examiner*—Khanh Dang
(74) *Attorney, Agent, or Firm*—Richard L. Miller

(57) ABSTRACT

A coaxial speaker system that includes an acoustic bass resonator, a lower speaker case that extends from the acoustic bass resonator, an upper speaker case that extends from the lower speaker case, and a coaxial speaker that interfaces with both the lower and upper speakers cases. The acoustic bass resonator and the lower and upper speaker cases are each tubular. The acoustic bass resonator has a pair of ports that extend therethrough. The lower speaker case has a pair of bass ports that extend through diametrically opposite sides thereof, a first diffuser panel that extends coaxially therein, and a second diffuser panel that extends coaxially therein, perpendicular to the first diffuser panel. The upper speaker case has a port that extends therethrough and is generally parabolic-shaped, and a high frequency deflector panel that is generally parabolic-shaped, extends skewly rearwardly therein, and cooperates with the port therein.

17 Claims, 3 Drawing Sheets

COAXIAL SPEAKER SYSTEM

BACKGROUND OF THE INVENTION

1. Field of the Invention

The present invention relates to a speaker system. More particularly, the present invention relates to a coaxial speaker system.

2. Description of the Prior Art

Numerous innovations for speaker systems have been provided in the prior art that will be described. Even though these innovations may be suitable for the specific individual purposes to which they address, however, they differ from the present invention.

A FIRST EXAMPLE, U.S. Pat. No. 4,164,988 to Virva teaches a loudspeaker system having a rigid framework which contains a high compliance loudspeaker connected to an adjustable air column tube. The adjustable air column tube provides exact ¼ wavelength tuning for the speaker system, to further improve its low frequency response, in accordance with tuned enclosure theory.

A SECOND EXAMPLE, U.S. Pat. No. 4,760,601 to Pappanikolaou teaches a high efficiency labyrinth type enclosure that uses chambers of triangular cross sectional area and a single speaker with two separate voice coils, in conjunction with two speaker back wave paths, one tuned for woofer frequencies and the other tuned for subwoofer frequencies, to simultaneously reproduce all woofer and subwoofer frequencies of both channels of a stereo signal.

A THIRD EXAMPLE, U.S. Pat. No. 5,864,100 to Newman teaches a speaker enclosure including a pair of tubular cylinders, one of which is slidable inside the other, the first of the tubular cylinders having one end closed, one end open, and an opening in the wall thereof, the second of the tubular cylinders having one end open and a speaker located in the other end thereof. The speaker enclosure may also include a pair of tubular cylinders, one of which is slidable inside the other, the first of the tubular cylinders having one end closed, one end open, a speaker in the open end, and an opening in the wall thereof, the second of the tubular cylinders having both ends open.

A FOURTH EXAMPLE, U.S. Pat. No. 5,988,314 to Negishi teaches a sound output system that has a pair of right and left speakers and a pair of audio mirrors for respectively controlling directivities of sounds which are output from the pair of speakers. The shapes or arrangement of the pair of audio mirrors are adjusted such that a difference between arrival times of the sounds which are respectively output from the pair of speakers can be compensated by a sound pressure difference due to the Haas effect in a predetermined area. Alternative means are phase difference, dipole, and asymmetrical horn loading.

A FIFTH EXAMPLE, U.S. Pat. No. 6,079,515 to Newman teaches a speaker enclosure including at least one pair of tubular cylinders, one of which is slidable inside the other, one of the tubular cylinders having one end open and a speaker located in the other end thereof. The speaker enclosure may also include additional cylinders to achieve desired acoustical effects.

It is apparent that numerous innovations for speaker systems have been provided in the prior art that are adapted to be used. Furthermore, even though these innovations may be suitable for the specific individual purposes to which they address, however, they would not be suitable for the purposes of the present invention as heretofore described.

SUMMARY OF THE INVENTION

ACCORDINGLY, AN OBJECT of the present invention is to provide a coaxial speaker system that avoids the disadvantages of the prior art.

ANOTHER OBJECT of the present invention is to provide a coaxial speaker system that is simple and inexpensive to manufacture.

STILL ANOTHER OBJECT of the present invention is to provide a coaxial speaker system that is simple to use.

BRIEFLY STATED, STILL YET ANOTHER OBJECT of the present invention is to provide a coaxial speaker system that includes an acoustic bass resonator, a lower speaker case that extends from the acoustic bass resonator, an upper speaker case that extends from the lower speaker case, and a coaxial speaker that interfaces with both the lower and upper speakers cases. The acoustic bass resonator and the lower and upper speaker cases are each tubular. The acoustic bass resonator has a pair of ports that extend therethrough. The lower speaker case has a pair of bass ports that extend through diametrically opposite sides thereof, a first diffuser panel that extends coaxially therein, and a second diffuser panel that extends coaxially therein, perpendicular to the first diffuser panel. The upper speaker case has a port that extends therethrough and is generally parabolic-shaped, and a high frequency deflector panel that is generally parabolic-shaped, extends skewly rearwardly therein, and cooperates with the port therein.

The novel features which are considered characteristic of the present invention are set forth in the appended claims. The invention itself, however, both as to its construction and its method of operation, together with additional objects and advantages thereof, will be best understood from the following description of the specific embodiments when read and understood in connection with the accompanying drawing.

BRIEF DESCRIPTION OF THE DRAWING

The figures of the drawing are briefly described as follows.

LIST OF REFERENCE NUMERALS UTILIZED IN THE DRAWING

Figure 1:
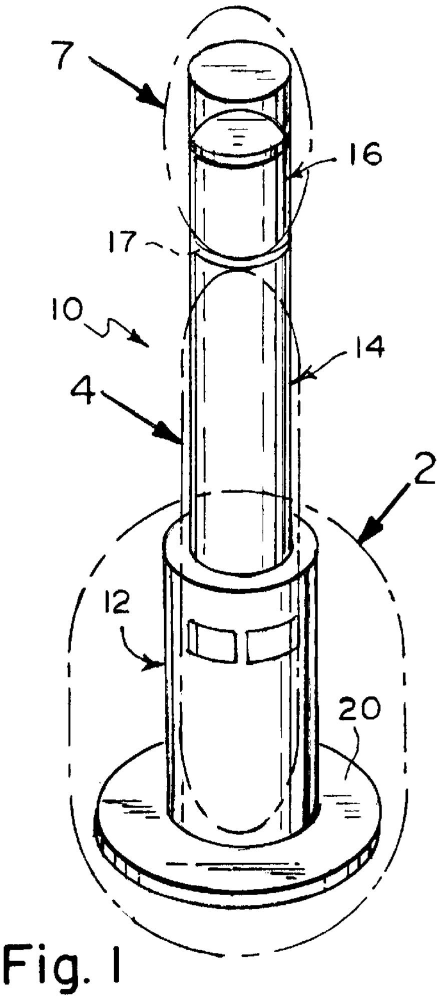
FIG. 1 is a diagrammatic perspective view of the present invention.

10 coaxial speaker system of present invention
12 acoustic bass resonator
14 lower speaker case
16 upper speaker case
17 coaxial speaker
18 lowermost end of acoustic bass resonator 12
20 base of acoustic bass resonator 12
22 uppermost end of acoustic bass resonator 12
23 throughbore extending coaxially through uppermost end 22 of acoustic bass resonator 12
24 side wall of acoustic bass resonator 12
26 pair of ports extending through one side of side wall 24 of acoustic bass resonator 12
28 lowermost end of lower speaker case 14
30 uppermost end of lower speaker case 14
32 side wall of lower speaker case 14
34 pair of base ports through lower speaker case 14
36 first diffuser panel in lower speaker case 14
38 uppermost end of first diffuser panel 36 in lower speaker case 14
40 lowermost end of first diffuser panel 36 in lower speaker case 14
42 second diffuser panel in lower speaker case 14
44 uppermost end of second diffuser panel 42 in lower speaker case 14
46 lowermost end of second diffuser panel 42 in lower speaker case 14
48 pair of pins of coaxial speaker 17
50 lowermost end of upper speaker case 16
52 uppermost end of upper speaker case 16
54 side wall of upper speaker case 16
56 port through upper speaker case 16
58 uppermost end of port 56 through upper speaker case 16
59 upper periphery of port 56 through upper speaker case 16
60 lowermost end of port 56 through upper speaker case 16
62 high frequency deflector panel in upper speaker case 16
64 uppermost end of high frequency deflector panel 62 in upper speaker case 16
66 lowermost end of high frequency deflector panel 62 in upper speaker case 16
68 ledge in upper speaker case 16
70 LED in upper speaker case 16

DETAILED DESCRIPTION OF THE PREFERRED EMBODIMENT

Referring now to the figures, in which like numerals indicate like parts, and particularly to FIG. 1, the coaxial speaker system of the present invention is shown generally at 10.

The coaxial speaker system 10 comprises an acoustic bass resonator 12, a lower speaker case 14 that extends from the acoustic bass resonator 12, an upper speaker case 16 that extends from the lower speaker case 14, and a coaxial speaker 17 that interfaces with the lower speaker case 14 and the upper speaker case 16.

Figure 2:
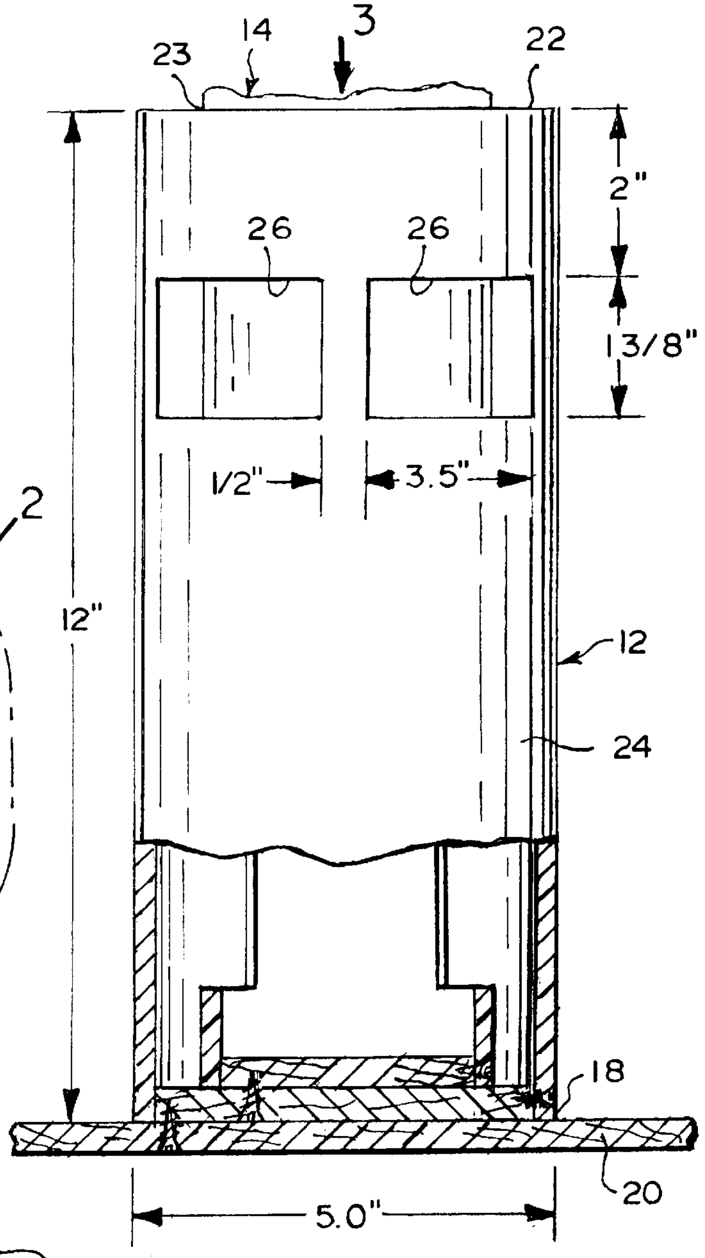
FIG. 2 is an enlarged diagrammatic side elevational view in partial section of the area generally enclosed by the dotted curve identified by arrow 2 in FIG. 1 of the acoustic resonator portion of the present invention with the lower speaker case of the present invention therein.
Figure 3:
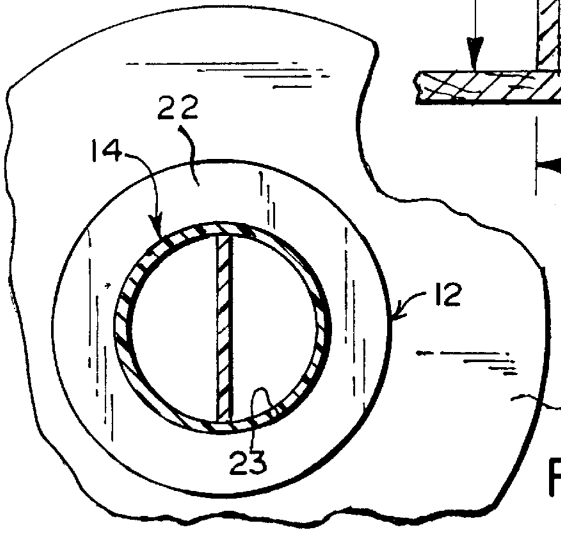
FIG. 3 is a diagrammatic top plan view taken generally in the direction of arrow 3 in FIG. 2.

The specific configuration of the acoustic bass resonator 12 can best be seen in FIGS. 2 and 3, and as such, will be discussed with reference thereto.

The acoustic bass resonator 12 is tubular, has a 3/16" thick wall, is 12" high and 5" in diameter, and has a lowermost end 18 that is closed and air-tight sealed by either screws or glue to a base 20 that is disk-shaped, an uppermost end 22 that has a throughbore 23 extending coaxially therethrough that is 3.5" in diameter, and a side wall 24 that is cylindrically-shaped and extends from the lowermost end 18 thereof to the uppermost end 22 thereof.

The acoustic bass resonator 12 further has a pair of ports 26 that extend through one side of the side wall 24 thereof. The pair of ports 26 through the acoustic bass resonator 12 are generally rectangular-shaped, are horizontally spaced-apart from each other by 0.5", are horizontally aligned with each other, and are disposed just below the uppermost end 22 thereof at 2". Each of the pair of ports 26 through the acoustic bass resonator 12 is 3.5" wide and 1.375" high The acoustic bass resonator 12 is made of cardboard.

Figure 4:
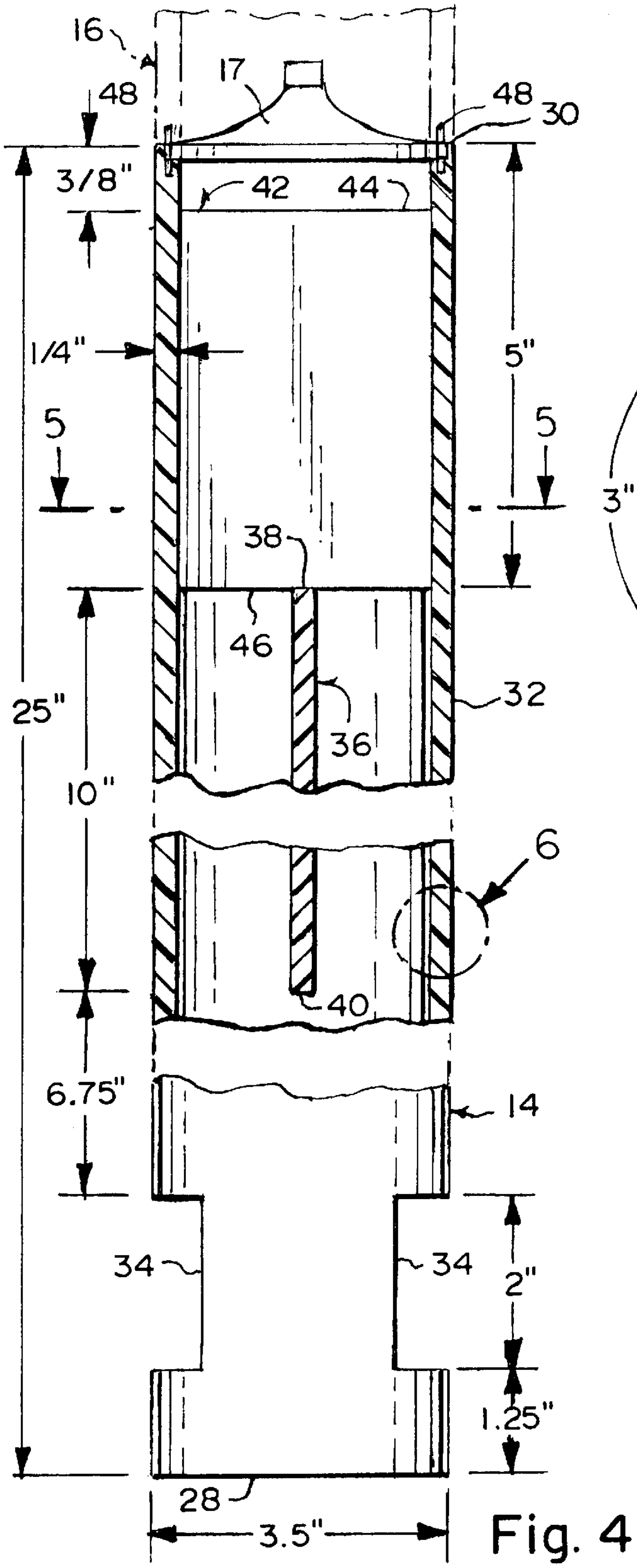
FIG. 4 is an enlarged diagrammatic side elevational view in partial section of the area generally enclosed by the dotted curve identified by arrow 4 in FIG. 1 of the lower speaker case of the present invention.
Figure 5:
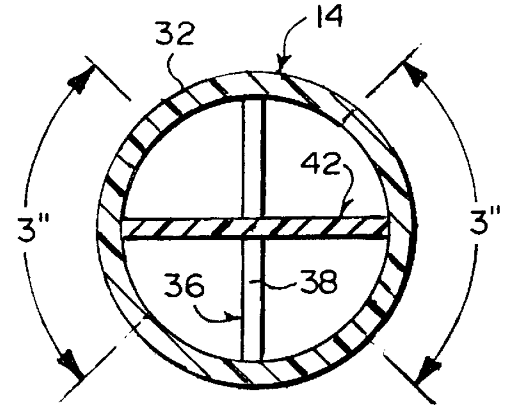
FIG. 5 is a diagrammatic cross sectional view taken along line 5—5 in FIG. 4.
Figure 6:
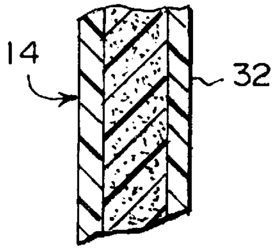
FIG. 6 is an enlarged diagrammatic cross sectional of the area generally enclosed by the dotted curve identified by arrow 6 in FIG. 4.

The specific configuration of the lower speaker case 14 can best be seen in FIGS. 4–6, and as such, will be discussed with reference thereto.

The lower speaker case 14 is tubular, has a 1/4" thick wall, is 25" high and 3.5" in diameter, is coaxially received in the acoustic bass resonator 12, and has a lowermost end 28 that is closed and air-tight sealed by either screws or glue to the lowermost end 18 of the acoustic bass resonator 12, an uppermost end 30 that is open, and a side wall 32 that is cylindrically-shaped and extends from the lowermost end 28 thereof to the uppermost end 30 thereof.

The lower speaker case 14 further has a pair of bass ports 34 that extend through diametrically opposite sides of the side wall 32 thereof. The pair of bass ports 34 through the lower speaker case 14 are generally rectangular-shaped, are horizontally spaced-apart from each other, are horizontally aligned with each other, and are disposed just above the lowermost end 28 thereof at 1.25". Each of the pair of bass ports 34 through the lower speaker case 14 is 3" wide and 2" high.

The lower speaker case 14 further has a first diffuser panel 36. The first diffuser panel 36 in the lower speaker case 14 is generally rectangular-shaped, extends coaxially within the lower speaker case 14 from an uppermost end 38 thereof that is 5" below the uppermost end 30 of the lower speaker case 14 to a lowermost end 40 thereof that is 6.75" above the pair of bass ports 34 through the lower speaker case 14, and extends laterally completely across the lower speaker case 14.

The lower speaker case 14 further has a second diffuser panel 42. The second diffuser panel 42 in the lower speaker case 14 is generally rectangular-shaped, extends coaxially within the lower speaker case 14 from an uppermost end 44 thereof that is 3/8" below the uppermost end 30 of the lower speaker case 14 to a lowermost end 46 thereof that sits on the first diffuser panel 36 in the lower speaker case 14, and extends laterally completely across the lower speaker case 14, perpendicularly to the first diffuser panel 36 in the lower speaker case 14.

The lower speaker case 14 is made of cellcore non-pressure PVC pipe manufactured by Plastics Corporation, Asheville, N.C. 28804, Silver Line-SCH40, Series ASTM F-891-98, NSF-DWV.

The coaxial speaker 17 sits on, and closes, the uppermost end 30 of the lower speaker case 14, faces into the lower speaker case 14, and is maintained thereat by a pair of pins 48 that are diametrically opposed to each other, and extend axially therein and into the side wall 32 of the lower speaker case 14.

Figure 7:
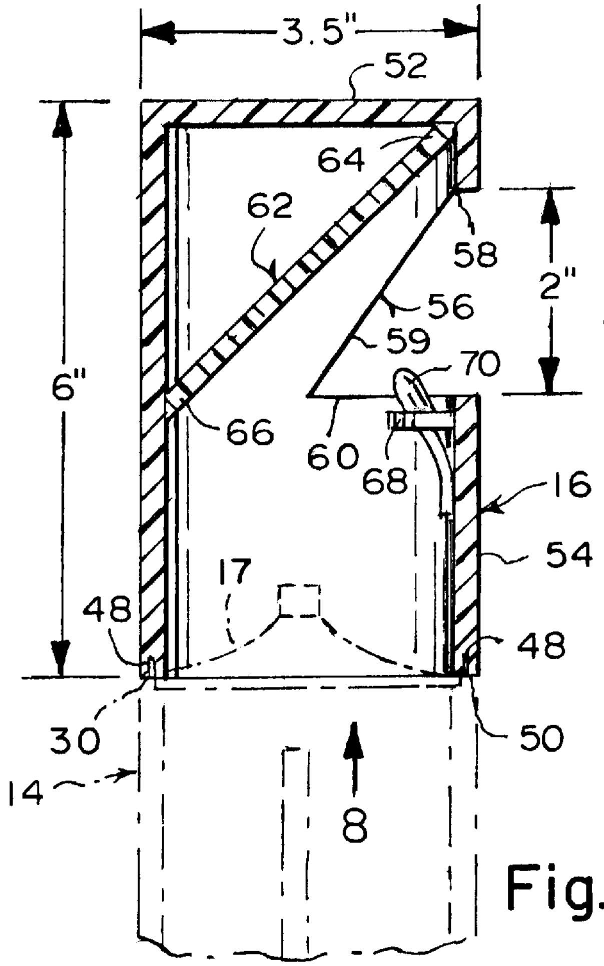
FIG. 7 is an enlarged diagrammatic cross sectional view in partial section of the area generally enclosed by the dotted curve identified by arrow 7 in FIG. 1 of the upper speaker case of the present invention.
Figure 8:
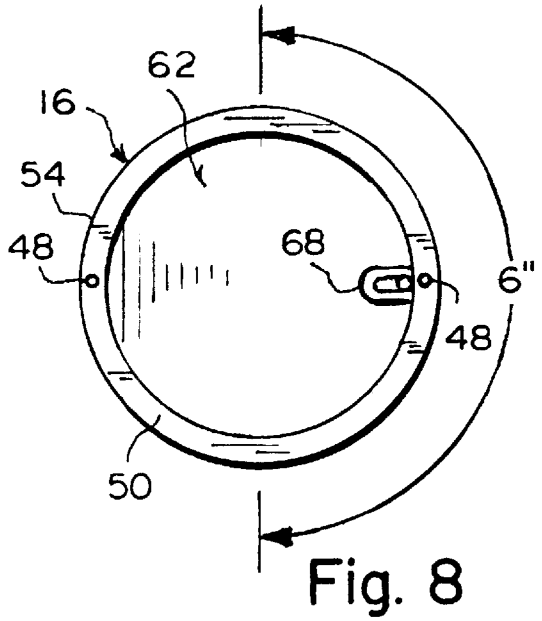
FIG. 8 is a diagrammatic bottom plan view taken generally in the direction of arrow 8 in FIG. 7.
Figure 9:
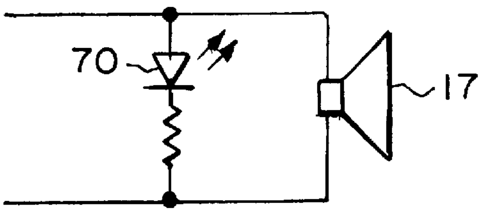
FIG. 9 is a schematic diagram of the circuit of the present invention.

The specific configuration of the upper speaker case can best be seen in FIGS. 7–9, and as such, will be discussed with reference thereto.

The upper speaker case 16 is tubular, has a 1/4" thick wall, is 6" high and 3.5" in diameter, extends coaxially from the lower speaker case 14, and has a lowermost end 50 that is open, coincident with, communicates with, and is air-tight sealed to, the uppermost end 30 of the lower speaker case 14, an uppermost end 52 that is closed, and a side wall 54 that is cylindrically-shaped and extends from the lowermost end 50 thereof to the uppermost end 52 thereof.

The coaxial speaker 17 is received by, and closes, the lowermost end 50 of the upper speaker case 16, and is maintained thereat by the pair of pins 48 extending axially into the side wall 54 of the upper speaker case 16.

The upper speaker case 16 further has a port 56 that extends through the side wall 54 thereof. The port 56 through the upper speaker case 16 is generally parabolic-shaped and depends axially at an uppermost end 58 thereof from just below the uppermost end 52 of the upper speaker case 16 divergingly so as to define an upper periphery 59 thereof to a lowermost end 60 thereof that is approximately midway between the uppermost end 52 of the upper speaker case 16 and the lowermost end 50 of the upper speaker case 16. The port 56 through the upper speaker case 16 is 6" wide at the lowermost end 60 thereof and 2" high and wraps 180 degrees around the upper speaker case 16 at the lowermost end 60 thereof.

The upper speaker case 16 further has a high frequency deflector panel 62. The high frequency deflector panel 62 in the upper speaker case 16 is generally parabolic-shaped, extends skewly rearwardly within the upper speaker case 16 from an uppermost end 64 thereof that is coincident with the uppermost end 58 of the port 56 through the upper speaker case 16 to a lowermost end 66 thereof that is disposed on the lowermost end 60 of the port 56 through the upper speaker case 16 so as to close the upper periphery 59 of the port 56 through the upper speaker case 16.

The upper speaker case 16 is also made of cellcore non-pressure PVC pipe.

The upper speaker case 16 further has a ledge 68 that extends slightly radially inwardly from the side wall 54 of the upper speaker case 16, at a level of the lowermost end 60 of the port 56 through the upper speaker case 16.

The upper speaker case 16 further has an LED 70 that extends upwardly from the ledge 68, in view through the port 56 through the upper speaker case 16.

The LED 70 in the upper speaker case 16 is in electrical communication with the coaxial speaker 17 and illuminates with an intensity proportional to that of the coaxial speaker 17.

It will be understood that each of the elements described above, or two or more together, may also find a useful application in other types of constructions differing from the types described above.

While the invention has been illustrated and described as embodied in a coaxial speaker system, however, it is not limited to the details shown, since it will be understood that various omissions, modifications, substitutions and changes in the forms and details of the device illustrated and its operation can be made by those skilled in the art without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute characteristics of the generic or specific aspects of this invention.

The invention claimed is:

1. A coaxial speaker system, comprising:

a) an acoustic bass resonator;

b) a lower speaker case;

c) an upper speaker case; and d) a coaxial speaker;

wherein said lower speaker case extends from said acoustic bass resonator;

wherein said upper speaker case extends from said lower speaker case; and wherein said coaxial speaker interfaces with said lower speaker case and said upper speaker case, wherein said acoustic bass resonator is tubular;

wherein said acoustic bass resonator has a lowermost end;

wherein said lowermost end of said acoustic bass resonator is closed;

wherein said lowermost end of said acoustic bass resonator is air-tight sealed to a base;

wherein said base is disk-shaped;

wherein said lowermost end of said acoustic bass resonator is air-tight sealed to said base by one of screws and glue;

wherein said acoustic bass resonator has an uppermost end;

wherein said uppermost end of said acoustic bass resonator has a throughbore extending coaxially therethrough;

wherein said acoustic bass resonator has a side wall;

wherein said side wall of said acoustic bass resonator is cylindrically-shaped; and wherein said side wall of said acoustic bass resonator extends from said lowermost end thereof to said uppermost end thereof.

2. The system as defined in claim 1, wherein said acoustic bass resonator has a pair of ports;

wherein said pair of ports extend through one side of said side wall of said acoustic bass resonator;

wherein said pair of ports through said acoustic bass resonator are generally rectangular-shaped;

wherein said pair of ports through said acoustic bass resonator are horizontally spaced-apart from each other;

wherein said pair of ports through said acoustic bass resonator are horizontally aligned with each other; and wherein said pair of ports through said acoustic bass resonator are disposed just below said uppermost end thereof.

3. The system as defined in claim 1, wherein said acoustic bass resonator is made of cardboard.

4. The system as defined in claim 1, wherein said lower speaker case is tubular;

wherein said lower speaker case is coaxially received in said acoustic bass resonator;

wherein said lower speaker case has a lowermost end;

wherein said lowermost end of said lower speaker case is closed;

wherein said lowermost end of said lower speaker case is air-tight sealed to said lowermost end of said acoustic bass resonator;

wherein said lower speaker case has an uppermost end;

wherein said uppermost end of said lower speaker case is open;

wherein said lower speaker case has a side wall;

wherein said side wall of said lower speaker case is cylindrically-shaped; and wherein said side wall of said lower speaker case extends from said lowermost end thereof to said uppermost end thereof.

5. The system as defined in claim 4, wherein said lower speaker case has a pair of bass ports;

wherein said pair of bass ports extend through diametrically opposite sides of said side wall of said lower speaker case;

wherein said pair of bass ports through said lower speaker case are generally rectangular-shaped;

wherein said pair of bass ports through said lower speaker case are horizontally spaced-apart from each other;

wherein said pair of bass ports through said lower speaker case are horizontally aligned with each other; and wherein said pair of bass ports through said lower speaker case are disposed just above the lowermost end thereof.

6. The system as defined in claim 5, wherein said lower speaker case has a first diffuser panel;

wherein said first diffuser panel in said lower speaker case is generally rectangular-shaped;

wherein said first diffuser panel in said lower speaker case extends coaxially within said lower speaker case from an uppermost end thereof that is below said uppermost end of said lower speaker case to a lowermost end thereof that is above said pair of bass ports through said lower speaker case; and wherein said first diffuser panel in said lower speaker case extends laterally completely across said lower speaker case.

7. The system as defined in claim 6, wherein said lower speaker case has a second diffuser panel;

wherein said second diffuser panel in said lower speaker case is generally rectangular-shaped;

wherein said second diffuser panel in said lower speaker case extends coaxially within said lower speaker case from an uppermost end thereof that is below said uppermost end of said lower speaker case to a lowermost end thereof that sits on said first diffuser panel in said lower speaker case;

wherein said second diffuser panel in said lower speaker case extends laterally completely across said lower speaker case; and wherein said second diffuser panel in said lower speaker case is perpendicular to said first diffuser panel in said lower speaker case.

8. The system as defined in claim 1, wherein said lower speaker case is made of cellcore non-pressure PVC pipe.

9. The system as defined in claim 4, wherein said coaxial speaker sits on said uppermost end of said lower speaker case;

wherein said coaxial speaker closes said uppermost end of said lower speaker case;

wherein said coaxial speaker faces into said lower speaker case;

wherein said coaxial speaker is maintained at said uppermost end of said lower speaker case by a pair of pins; and wherein said pair of pins extend axially in said coaxial speaker and into said side wall of said lower speaker case.

10. The system as defined in claim 9, wherein said upper speaker case is tubular;

wherein said upper speaker case extends coaxially from said lower speaker case;

wherein said upper speaker case has a lowermost end;

wherein said lowermost end of said upper speaker case is open;

wherein said lowermost end of said upper speaker case is coincident with said uppermost end of said lower speaker case;

wherein said lowermost end of said upper speaker case communicates with said uppermost end of said lower speaker case;

wherein said lowermost end of said upper speaker case is air-tight sealed to said uppermost end of said lower speaker case;

wherein said upper speaker case has an uppermost end;

wherein said uppermost end of said upper speaker case is closed;

wherein said upper speaker case has a side wall;

wherein said side wall of said upper speaker case is cylindrically-shaped; and wherein said side wall of said upper speaker case extends from said lowermost end thereof to said uppermost end thereof.

11. The system as defined in claim 10, wherein said coaxial speaker is received by said lowermost end of said upper speaker case;

wherein said coaxial speaker closes said lowermost end of said upper speaker case;

wherein said coaxial speaker is maintained at said lowermost end of said upper speaker case by said pair of pins; and wherein aid pair of pins extend axially into said side wall of said upper speaker case.

12. The system as defined in claim 10, wherein said upper speaker case has a port;

wherein said port extends through said side wall of said upper speaker case;

wherein said port through said upper speaker case is generally parabolic-shaped;

wherein said port through said upper speaker case depends axially at an uppermost end thereof from just below said uppermost end of said upper speaker case divergingly so as to define an upper periphery thereof to a lowermost end thereof that is approximately midway between said uppermost end of said upper speaker case and said lowermost end of said upper speaker case; and wherein said port wraps 180 degrees around said upper speaker case at said lowermost end thereof.

13. The system as defined in claim 12, wherein said upper speaker case has a high frequency deflector panel;

wherein said high frequency deflector panel in said upper speaker case is generally parabolic-shaped;

wherein said high frequency deflector panel extends skewly rearwardly within said upper speaker case from an uppermost end thereof that is coincident with said uppermost end of said port through said upper speaker case to a lowermost end thereof that is disposed on said lowermost end of said port through said upper speaker case so as to close said upper periphery of said port through said upper speaker case.

14. The system as defined in claim 1, wherein said upper speaker case is made of cellcore non-pressure PVC pipe.

15. The system as defined in claim 12, wherein said upper speaker case has a ledge;

wherein said ledge extends slightly radially inwardly from said side wall of said upper speaker case; and wherein said ledge is disposed at a level of said lowermost end of said port through said upper speaker case.

16. The system as defined in claim 15, wherein said upper speaker case has an LED;

wherein said LED extends upwardly from said ledge in said upper speaker case; and wherein said LED is in view through said port through said upper speaker case.

17. The system as defined in claim 16, wherein said LED in said upper speaker case is in electrical communication with said coaxial speaker; and wherein said LED in said upper speaker case illuminates with an intensity proportional to that of said coaxial speaker.

* * * * *